(12) United States Patent
Yamashina et al.

(10) Patent No.: US 12,147,374 B2
(45) Date of Patent: Nov. 19, 2024

(54) DISTRIBUTED CONTROL SYSTEM AND SEMICONDUCTOR INSPECTION APPARATUS INCLUDING SAME

(71) Applicant: Hitachi High-Tech Corporation, Tokyo (JP)

(72) Inventors: Kazushi Yamashina, Tokyo (JP); Takashi Saegusa, Tokyo (JP); Yoshiro Gunji, Tokyo (JP); Tetsuji Ohsawa, Tokyo (JP); Yutaka Kasai, Tokyo (JP); Junichi Kitamura, Tokyo (JP); Naoya Ishigaki, Tokyo (JP); Shusaku Maeda, Tokyo (JP); Yoshikuni Yokose, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 24 days.

(21) Appl. No.: 18/008,387

(22) PCT Filed: Jun. 11, 2020

(86) PCT No.: PCT/JP2020/023030
§ 371 (c)(1),
(2) Date: Dec. 5, 2022

(87) PCT Pub. No.: WO2021/250851
PCT Pub. Date: Dec. 16, 2021

(65) Prior Publication Data
US 2023/0315673 A1    Oct. 5, 2023

(51) Int. Cl.
*G06F 13/42* (2006.01)
*G01R 31/26* (2020.01)
*G06F 13/34* (2006.01)

(52) U.S. Cl.
CPC ..... *G06F 13/4247* (2013.01); *G01R 31/2601* (2013.01); *G06F 13/34* (2013.01)

(58) Field of Classification Search
None
See application file for complete search history.

(56) References Cited

U.S. PATENT DOCUMENTS

| | | | |
|---|---|---|---|
| 2001/0016891 A1* | 8/2001 | Hagino | G06F 13/385 710/305 |
| 2015/0127707 A1 | 5/2015 | Saegusa et al. | |

FOREIGN PATENT DOCUMENTS

| | | |
|---|---|---|
| JP | 2006-245882 A | 9/2006 |
| JP | 2011-024027 A | 2/2011 |
| JP | 2014-023021 A | 2/2014 |

OTHER PUBLICATIONS

English Translation of the International Search Report issued in corresponding International Application No. PCT/JP2020/023030, dated Sep. 15, 2020.

(Continued)

*Primary Examiner* — Farley Abad
*Assistant Examiner* — Dayton Lewis-Taylor
(74) *Attorney, Agent, or Firm* — Foley & Lardner LLP

(57) ABSTRACT

A distributed control system includes a tree topology network or a daisy-chain network including a communication parent station, communication child stations, and a plurality of communication paths among the communication parent station and the communication child stations, in which the communication parent station and the communication child stations include a scheduling unit that controls a transfer cycle that is temporal intervals of data transfer. The scheduling unit sets the transfer cycle that is the fastest out of a plurality of the data as a reference cycle, counts the number of times each time the reference cycle elapses, and imparts a value of the number of times to the reference cycle as a cycle number. When the cycle number reaches an optional number, the number of times is returned to an initial value, which makes one cycle of transfer control, and the transfer (Continued)

control is repeatedly executed. For the timing of the reference cycle at which the data is transferred, the scheduling unit defines a cycle number to which the reference cycle corresponds, on the basis of first information corresponding to the data.

19 Claims, 11 Drawing Sheets

(56) References Cited

OTHER PUBLICATIONS

Taiwanese Office Action issued in corresponding Taiwanese Patent Application No. 110120592, dated May 12, 2022.

* cited by examiner

FIG. 10

```
         CYCLE NUMBER   ADDRESS GROUPS OF RECEIVED DATA
         ⎧ cycle 1   [0x140, 0x14C, 0x188, 0x18C, 0x3F0, 0x6F0, 0x164]
         ⎪ cycle 2   [0x140, 0x14C, 0x188, 0x18C, 0x3F0, 0x6F0, 0x168]
         ⎪ cycle 3   [0x140, 0x14C, 0x188, 0x18C, 0x3F0, 0x6F0, 0x16C]
         ⎪ cycle 4   [0x140, 0x14C, 0x188, 0x18C, 0x3F0, 0x6F0, 0x1A4]
         ⎪ cycle 5   [0x140, 0x14C, 0x188, 0x18C, 0x3F0, 0x6F0, 0x1A8]
         ⎪ cycle 6   [0x140, 0x14C, 0x188, 0x18C, 0x3F0, 0x6F0, 0x1AC]
         ⎪ cycle 7   [0x140, 0x14C, 0x188, 0x18C, 0x3F0, 0x6F0, 0x2A4]
         ⎪ cycle 8   [0x140, 0x14C, 0x188, 0x18C, 0x3F0, 0x6F0, 0x410]
  1000   ⎪ cycle 9   [0x140, 0x14C, 0x188, 0x18C, 0x3F0, 0x6F0, 0x430]
         ⎪ cycle 10  [0x140, 0x14C, 0x188, 0x18C, 0x3F0, 0x6F0, 0x450]
ONE CYCLE OF cycle 11  [0x140, 0x14C, 0x188, 0x18C, 0x3F0, 0x6F0, 0x470]
COMMUNICATION cycle 12 [0x140, 0x14C, 0x188, 0x18C, 0x3F0, 0x6F0, 0x4B4]
BAND CONTROL cycle 13  [0x140, 0x14C, 0x188, 0x18C, 0x3F0, 0x6F0, 0x4C4]
         ⎪ cycle 14  [0x140, 0x14C, 0x188, 0x18C, 0x3F0, 0x6F0, 0x4D4]
         ⎪ cycle 15  [0x140, 0x14C, 0x188, 0x18C, 0x3F0, 0x6F0, 0x4E4]
         ⎪ cycle 16  [0x140, 0x14C, 0x188, 0x18C, 0x3F0, 0x6F0, 0x508]
         ⎪ cycle 17  [0x140, 0x14C, 0x188, 0x18C, 0x3F0, 0x6F0, 0x50C]
         ⎪ cycle 18  [0x140, 0x14C, 0x188, 0x18C, 0x3F0, 0x6F0, 0x510]
         ⎪ cycle 19  [0x140, 0x14C, 0x188, 0x18C, 0x3F0, 0x6F0, 0x514]
         ⎩ cycle 20  [0x140, 0x14C, 0x188, 0x18C, 0x3F0, 0x6F0]
         ⎧ cycle 1   [0x140, 0x14C, 0x188, 0x18C, 0x3F0, 0x6F0, 0x164]
         ⎪ cycle 2   [0x140, 0x14C, 0x188, 0x18C, 0x3F0, 0x6F0, 0x168]
         ⎪ cycle 3   [0x140, 0x14C, 0x188, 0x18C, 0x3F0, 0x6F0, 0x16C]
         ⎪ cycle 4   [0x140, 0x14C, 0x188, 0x18C, 0x3F0, 0x6F0, 0x1A4]
         ⎪ cycle 5   [0x140, 0x14C, 0x188, 0x18C, 0x3F0, 0x6F0, 0x1A8]
         ⎪ cycle 6   [0x140, 0x14C, 0x188, 0x18C, 0x3F0, 0x6F0, 0x1AC]
         ⎪ cycle 7   [0x140, 0x14C, 0x188, 0x18C, 0x3F0, 0x6F0, 0x2A4]
         ⎪ cycle 8   [0x140, 0x14C, 0x188, 0x18C, 0x3F0, 0x6F0, 0x410]
  1000   ⎪ cycle 9   [0x140, 0x14C, 0x188, 0x18C, 0x3F0, 0x6F0, 0x430]
         ⎪ cycle 10  [0x140, 0x14C, 0x188, 0x18C, 0x3F0, 0x6F0, 0x450]
         ⎪ cycle 11  [0x140, 0x14C, 0x188, 0x18C, 0x3F0, 0x6F0, 0x470]
         ⎪ cycle 12  [0x140, 0x14C, 0x188, 0x18C, 0x3F0, 0x6F0, 0x4B4]
         ⎪ cycle 13  [0x140, 0x14C, 0x188, 0x18C, 0x3F0, 0x6F0, 0x4C4]
         ⎪ cycle 14  [0x140, 0x14C, 0x188, 0x18C, 0x3F0, 0x6F0, 0x4D4]
         ⎪ cycle 15  [0x140, 0x14C, 0x188, 0x18C, 0x3F0, 0x6F0, 0x4E4]
         ⎪ cycle 16  [0x140, 0x14C, 0x188, 0x18C, 0x3F0, 0x6F0, 0x508]
         ⎪ cycle 17  [0x140, 0x14C, 0x188, 0x18C, 0x3F0, 0x6F0, 0x50C]
         ⎪ cycle 18  [0x140, 0x14C, 0x188, 0x18C, 0x3F0, 0x6F0, 0x510]
         ⎪ cycle 19  [0x140, 0x14C, 0x188, 0x18C, 0x3F0, 0x6F0, 0x514]
         ⎩ cycle 20  [0x140, 0x14C, 0x188, 0x18C, 0x3F0, 0x6F0]
                                       ⋮
```

DISTRIBUTED CONTROL SYSTEM AND SEMICONDUCTOR INSPECTION APPARATUS INCLUDING SAME

TECHNICAL FIELD

The present invention relates to a distributed control apparatus that controls an entire system by means of a plurality of units, and a communication technology for industrial apparatuses including a semiconductor inspection apparatus that uses the distributed control apparatus.

BACKGROUND ART

In a semiconductor inspection apparatus, an electronic control system that includes analog input/output paths from a plurality of centrally managed control boards to a sensor or an actuator mounted on the apparatus is generally used. However, in the current system, because an increase in the amount of wiring, substrate redesign, and the like, occur in accordance with function expansion, it is difficult to cope with the diversification in apparatus needs that has been increasing in recent years. Thus, there is a pressing need to improve design productivity of an electronic system.

Therefore, by applying a network-type distributed control system to an in-apparatus electronic system, an improvement in function expandability can be expected while reducing analog wiring.

However, when a network-type distributed control system is introduced into a semiconductor inspection apparatus, a high-speed constant cycle and low-delay input/output for performing control of the apparatus are required, and thus it is necessary to secure a data communication band. For example, in JP 2011-2402 A (PTL 1), a software control unit and a hardware control unit are provided. The software control unit includes a scheduler unit that performs scheduling processing in which a scheduled transmission time is calculated for each piece of data enqueued in each of a plurality of queues for which priority level set values are set according to the types of data to be stored, on the basis of the priority level set values set for the queues, and in which the data is dequeued and outputted to the hardware control unit together with time information indicating the scheduled transmission time, thereby securing a communication band for data with a high priority level.

CITATION LIST

Patent Literature

PTL 1: JP 2011-24027 A

SUMMARY OF INVENTION

Technical Problem

Nevertheless, in the case of the technology disclosed in PTL 1, while the communication band can be secured, data is occasionally discarded or delayed depending on the data type.

An object of the present invention is to provide a distributed control system, and a semiconductor inspection apparatus that includes the distributed control system, that execute data communication necessary for apparatus control at high speed while maintaining a certain communication delay for all data requiring an input/output.

Solution to Problem

In order to solve the foregoing problem, the present invention is a distributed control system including a tree topology network or a daisy-chain network including a communication parent station, communication child stations, and a plurality of communication paths among the communication parent station and the communication child stations, wherein the communication parent station and the communication child stations include a scheduling unit that controls a transfer cycle that is temporal intervals of data transfer, the scheduling unit sets the transfer cycle that is the fastest out of a plurality of the data as a reference cycle, counts the number of times each time the reference cycle elapses, and imparts a value of the number of times to the reference cycle as a cycle number, when the cycle number reaches an optional number, the number of times is returned to an initial value, which makes one cycle of transfer control, and the transfer control is repeatedly executed, and for the timing of the reference cycle at which the data is transferred, the scheduling unit executes scheduling processing to define a cycle number to which the reference cycle corresponds, on the basis of first information corresponding to the data.

Advantageous Effects of Invention

According to the present invention, it is possible to provide a distributed control system, and a semiconductor inspection apparatus that includes the distributed control system, that execute data communication necessary for apparatus control at high speed while maintaining a certain communication delay for all data requiring an input/output.

BRIEF DESCRIPTION OF DRAWINGS

FIG. 10 is an example of an address log of data received through transfer control.

DESCRIPTION OF EMBODIMENTS

Hereinafter, embodiments according to the present invention will be described with reference to the drawings.

First Embodiment

Figure 1:
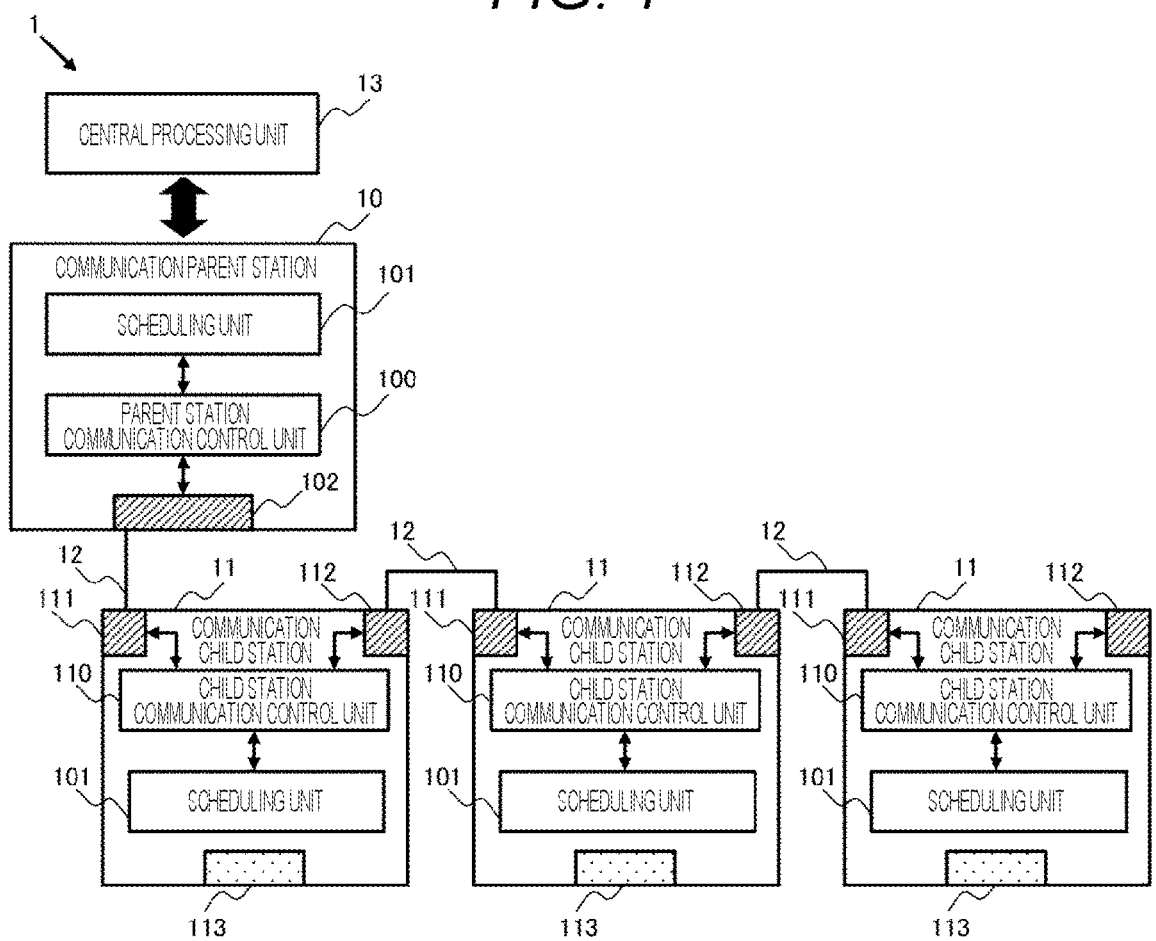
FIG. 1 is a diagram illustrating a configuration example of a distributed control system.

FIG. 1 is a diagram illustrating a configuration example of a distributed control system. As illustrated in FIG. 1, a distributed control system 1 of this embodiment includes a communication parent station 10, communication child stations 11, and a central processing unit 13. Here, the communication parent station 10 includes a parent station communication control unit 100, a scheduling unit 101, and a communication port 102, and is connected to the central processing unit 13, is further connected to a communication child station 11 via a communication path 12, and manages communication control of the distributed control network. Furthermore, the communication child stations 11 include a child station communication control unit 110, a scheduling unit 101, an upstream communication port 111, a downstream communication port 112, and an input/output port 113, is connected to another communication child station 11 or the communication parent station 10 or to both via the communication path 12, and receives or relays data transferred from the communication parent station 10 and transfers or relays data to the communication parent station 10. The central processing unit 13 is connected to the communication parent station 10 and executes the operation and setting of the distributed control system 1.

In the distributed control system 1, the upstream communication port 111 of a communication child station 11 is connected to the communication port 102 of the communication parent station 10 or to the downstream communication port 112 of a communication child station 11. In addition, for the sake of expediency in the description, communication in the direction from the communication parent station 10 to the communication child station 11 is defined as the upstream direction, and communication in the direction from the communication child station 11 to the communication parent station 10 is defined as the downstream direction. At this time, the distributed control system 1 performs communication band control in all data communication handled by the distributed control system 1 by executing the scheduling processing and transfer control of the scheduling units 101 of the communication parent station 10 and the communication child stations 11.

Figure 2:
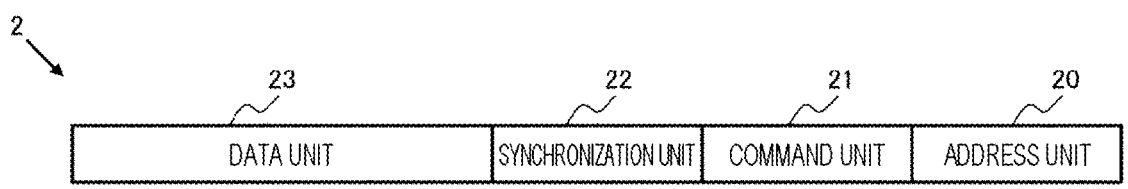
FIG. 2 is a diagram illustrating an example of a data structure.

FIG. 2 is an example of a structure of a packet 2 of data communicated in the distributed control system 1. The packet 2 includes an address unit 20, a command unit 21, a synchronization unit 22, and a data unit 23. Here, the address unit 20 determines the transfer destination of the packet 2, the command unit 21 discriminates the type of a function for controlling and managing the distributed control system 1, the synchronization unit 22 discriminates a communication cycle, and the data unit 23 stores data for which communication is desired.

Next, a detailed configuration of each communication station will be described.

Figure 3:
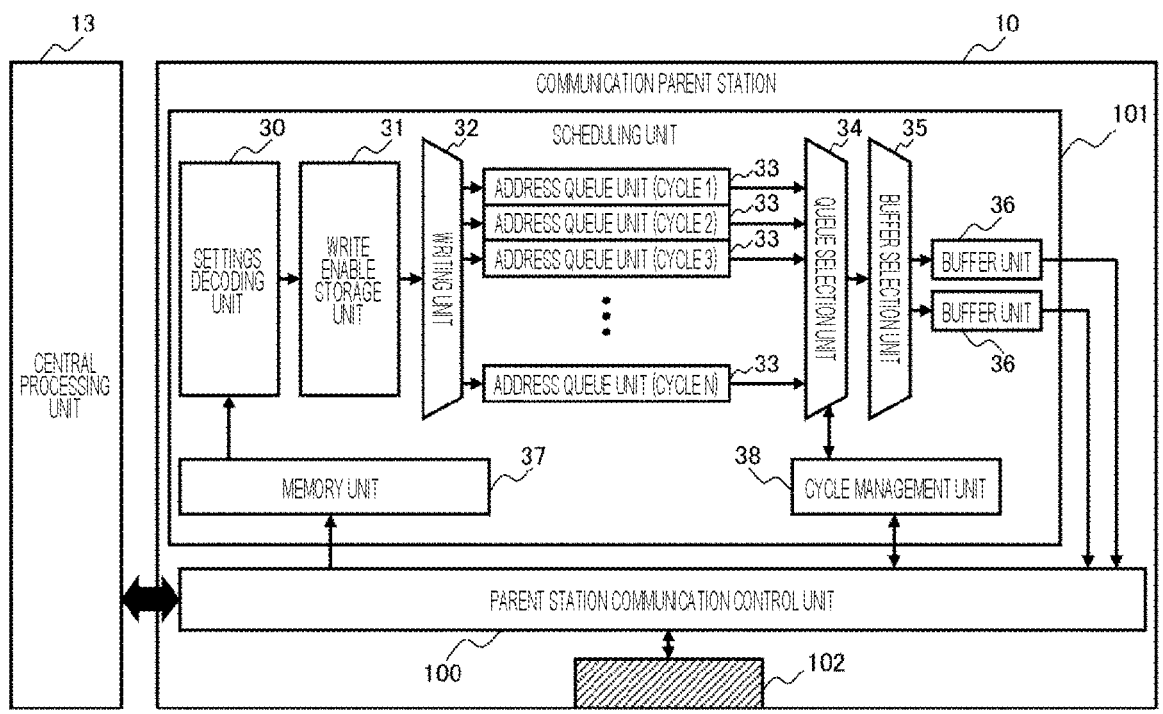
FIG. 3 is a schematic diagram illustrating details of a communication parent station.

FIG. 3 is a diagram illustrating details of the communication parent station 10. As illustrated in FIG. 3, the communication parent station 10 includes a parent station communication control unit 100, a scheduling unit 101, and a communication port 102. Here, when the communication parent station 10 transfers data, the parent station communication control unit 100 converts digital data into a transmission signal and transfers the transmission signal to the communication port 102 or executes the reverse. The scheduling unit 101 executes the scheduling processing and transfer control of the distributed control system 1. The communication port 102 relays a transmission signal between the parent station communication control unit 100 and the communication path 12.

Further, details of the scheduling unit 101 will be described. The scheduling unit 101 includes a settings decoding unit 30, a write enable storage unit 31, a writing unit 32, at least one address queue unit 33, a queue selection unit 34, a buffer selection unit 35, at least one buffer unit 36, a memory unit 37, and a cycle management unit 38. Here, the settings decoding unit 30 reads information stored in the memory unit 37 and further interprets the content thereof. The write enable storage unit 31 outputs a write enable that is defined in advance on the basis of the content of the information obtained by the settings decoding unit 30. The writing unit 32 selects the address queue unit 33 to which information is to be written on the basis of the write enable outputted by the write enable storage unit 31. The address queue unit 33 stores the addresses of data which is transmitted and received under the transfer control. During the execution of transfer control, the queue selection unit 34 selects an appropriate address queue unit 33 and reads information stored in the address queue unit 33. The buffer selection unit 35 selects the buffer unit 36 on the basis of the information outputted from the queue selection unit 34. Each buffer unit 36 stores and outputs the address of data to be received or the address of data to be transmitted. The memory unit 37 stores information necessary for scheduling processing. The cycle management unit 38 counts the number of times a reference cycle necessary for transfer control has elapsed.

Note that details of the transfer control, the scheduling processing, and the reference cycle will be described subsequently. The communication parent station 10 is connected to the central processing unit 13 and writes information from the central processing unit 13 to the memory unit 37.

Figure 4:
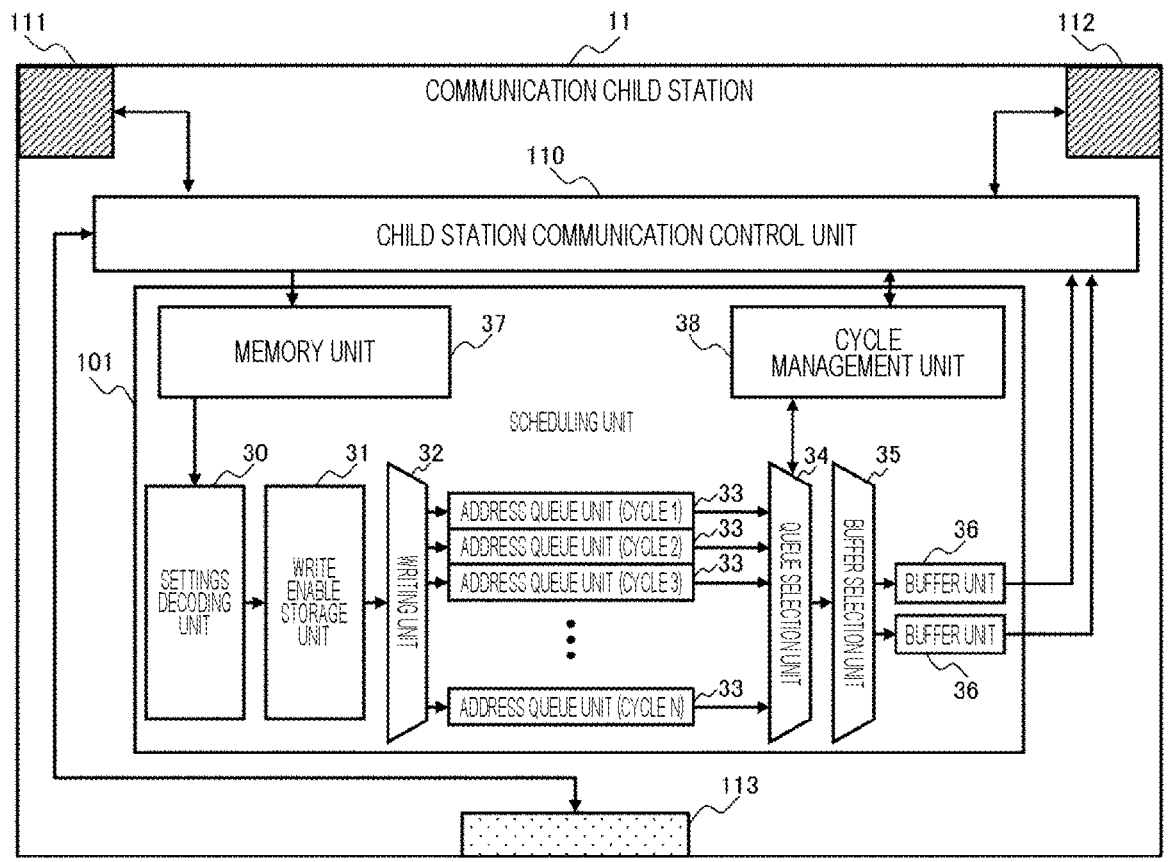
FIG. 4 is a schematic diagram illustrating details of a communication child station.

FIG. 4 is a diagram illustrating details of the communication child stations 11. As illustrated in FIG. 4, the communication child station 11 includes a child station communication control unit 110, an upstream communication port 111, a downstream communication port 112, and an input/output port 113. Here, the child station communication control unit 110 receives a transmission signal transmitted from the communication parent station 10 or another communication child station 11 via the upstream communication port 111, converts the transmission signal into digital data or executes the reverse, and relays the transmission signal transmitted from the communication parent station 10 or the other communication child station 11 to another communication child station 11 via the downstream communication port 112. The upstream communication port 111 and the downstream communication port 112 relay the transmission signal flowing through the child station communication control unit 110 and the communication path 12. The input/output port 113 relays information received by the communication child station 11 when outputting the information to another control device, and relays the information to the communication child station 11 in response to an input from the other control device. Note that the communication child station 11 also includes the scheduling unit 101, which is the same as the scheduling unit 101 mounted in the communication parent station 10, and a description thereof will be omitted.

Figure 5:
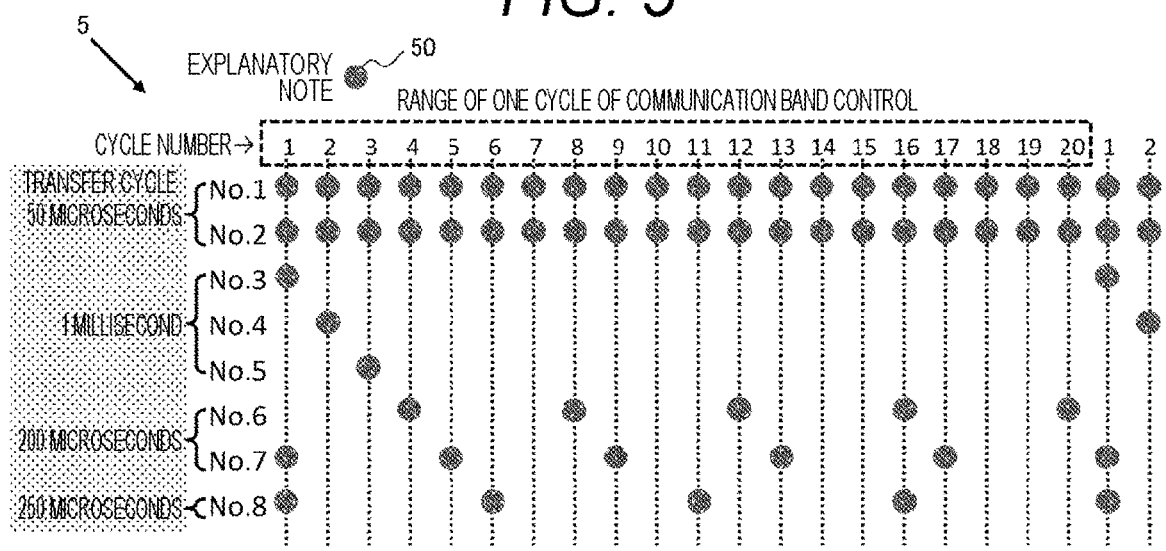
FIG. 5 is a diagram illustrating a timetable for data transfer.

Here, the communication band control executed by the distributed control system 1 will be described. A timetable 5 for data transfer when the communication band control is applied is illustrated in FIG. 5. Here, it is assumed that there are eight types, namely No. 1 to No. 8, of transfer data 50 of data to be transferred, and that the transfer cycle is determined according to the priority levels of each piece of transfer data 50, that is, 50 microseconds, 1 millisecond, 200 microseconds, and 250 microseconds, respectively. The transfer cycle of the data to be transferred at the highest priority level and at the highest speed among all the data to be transferred is set as the reference cycle. At this time, the data that can be the fastest cycle is, for example, control data necessary for computation of control of the apparatus. In the case of FIG. 5, 50 microseconds for No. 1 and No. 2 are applicable. Further, every time 50 microseconds of the reference cycle have elapsed, the number of times is counted, and the value is assigned to each reference cycle as a cycle number, as illustrated in FIG. 5. When this cycle number reaches an optional number (20 in FIG. 5), the cycle number is returned to an initial value (1 in FIG. 5), which is set as one cycle of communication band control, and repeated data transfer is performed. Therefore, in the communication band control, the transmission or reception of data is transferred in one cycle according to the transfer timing of the transfer data 50 defined in the timetable 5; for example, the transfer data 50 of No. 1, No. 2, and No. 4 is transferred in the reference cycle of the cycle number 2.

As described above, in order to execute communication band control, it is necessary to determine the transfer timing, as per the timetable 5, for all the transfer data 50. The transfer timing is defined by each piece of information of a communication direction of the data in the upstream direction or the downstream direction, a cycle number of a reference cycle for starting the transfer, and a temporal interval from when the transfer data 50 is transferred to when the next transfer data 50 is transferred. In addition, when the transfer timing is determined, the transfer data 50 transferred in each reference cycle is arranged so as to be distributed. For example, the transfer data 50 of No. 6 and No. 7 of 200 microseconds are both transferred once every four reference cycles, but are alternately transferred. By determining the transfer timing in this manner, the number of pieces of transfer data 50 of each reference cycle can be distributed, and the communication band can be controlled.

The scheduling processing and transfer control that constitute communication band control will be described below.

Figure 6:
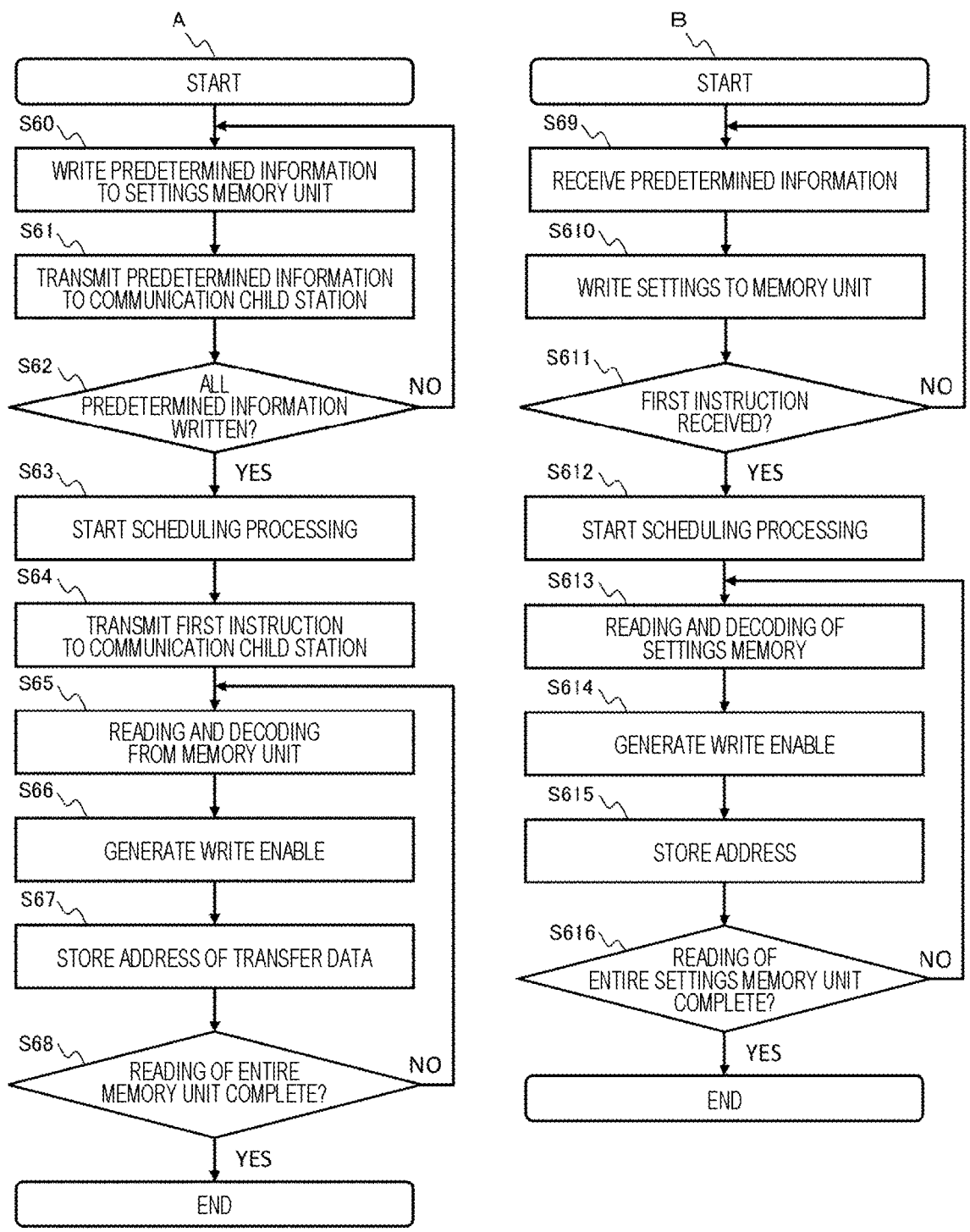
FIG. 6 is a flowchart illustrating a procedure for scheduling processing.

The scheduling processing is pre-preparation processing performed by the scheduling unit 101 in order to implement transfer control. FIG. 6 is a flowchart illustrating a procedure for the scheduling processing executed by the scheduling unit 101 of the communication parent station 10 and the communication child stations 11, where A is a procedure in the communication parent station 10 and B is a procedure in the communication child stations 11.

First, A will be described. In the communication parent station 10, first, in S60, the central processing unit 13 writes predetermined information to the memory unit 37. Here, the predetermined information is information for determining the transfer timing. Next, in S61, the predetermined information is also transmitted to the communication child station. S60 and S61 are repeated, and in a case where it is determined in S62 that the writing of all the predetermined information has been completed, the scheduling processing is started in S63. At this time, in S64, a first instruction, which is a notification of the start of the scheduling processing, is transmitted to the communication child station 11. Next, in S65, predetermined information is read from the memory unit 37, and the settings decoding unit 30 interprets the content. In S66, a write enable 70 held in the write enable storage unit 31 is outputted on the basis of the interpretation result in the settings decoding unit 30. In S67, the address queue unit 33 is selected by the write enable 70, and the address of the data corresponding to the predetermined information read in S65 is stored in the selected address queue unit 33. Here, the scheduling unit 101 includes an address queue unit 33 that corresponds to each cycle number, and a plurality of addresses stored in each address queue unit 33 is a set of data transferred in the reference cycle of the cycle number. Finally, when the entire memory unit 37 is read in S67, the scheduling processing is complete.

Next, B will be described. The communication child station 11 receives the predetermined information transmitted from the communication parent station 10 in S69, and writes the information received in S610 to the memory unit 37. Next, when the first instruction is received in S611, the scheduling unit starts the scheduling processing in S612. Because the processing from S613 onwards is the same as the processing of S65, a description thereof will be omitted.

Figure 7:
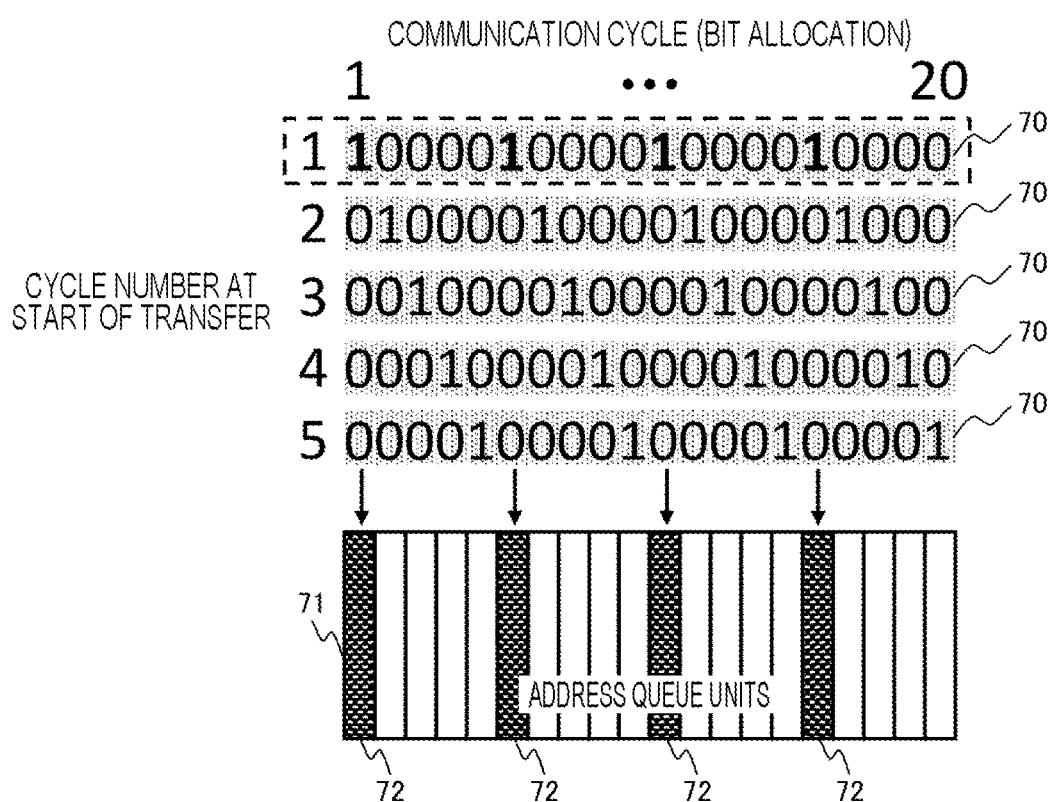
FIG. 7 is a diagram illustrating a mechanism for selecting an address queue unit from a write enable.

Here, the write enable 70 will be described. FIG. 7 illustrates a mechanism with which the address queue unit 33 is selected by the write enable 70. The write enable 70 is configured from the same number of flags of "1" or "0" as the cycle number. The example of FIG. 7 illustrates a case where there are cycle numbers from 1 to 20 similarly to the example of FIG. 5, and is a case where No. 9 of the transfer data 50 of FIG. 5 is set. Further, the plurality of address queue units 71 is a set of address queue units 33. In the write enable 70, the flag corresponding to the write target address queue unit 33 is "1", and the flag not corresponding thereto is "0". When No. 9 of the transfer data 50 is set, because the reference cycle is 50 microseconds and the transfer cycle is 250 microseconds, the time interval from the transfer of the transfer data 50 to the transfer of the next transfer data 50 is "5". Therefore, in this case, as illustrated in FIG. 7, five types of write enable 70 can be generated according to the cycle number of the reference cycle in which the transfer is started. Because the transfer of No. 9 of the transfer data 50 is started from cycle number "1", the first, sixth, eleventh, and sixteenth of the write enable 70 are "1" as illustrated in FIG. 7, and the transfer target queue 72 is selected from among the plurality of address queue units 71, and the addresses thereof are stored. Therefore, the transfer data 50 of No. 9 is transferred in the reference cycles of the cycle numbers "1", "6", "11", and "16".

Figure 8:
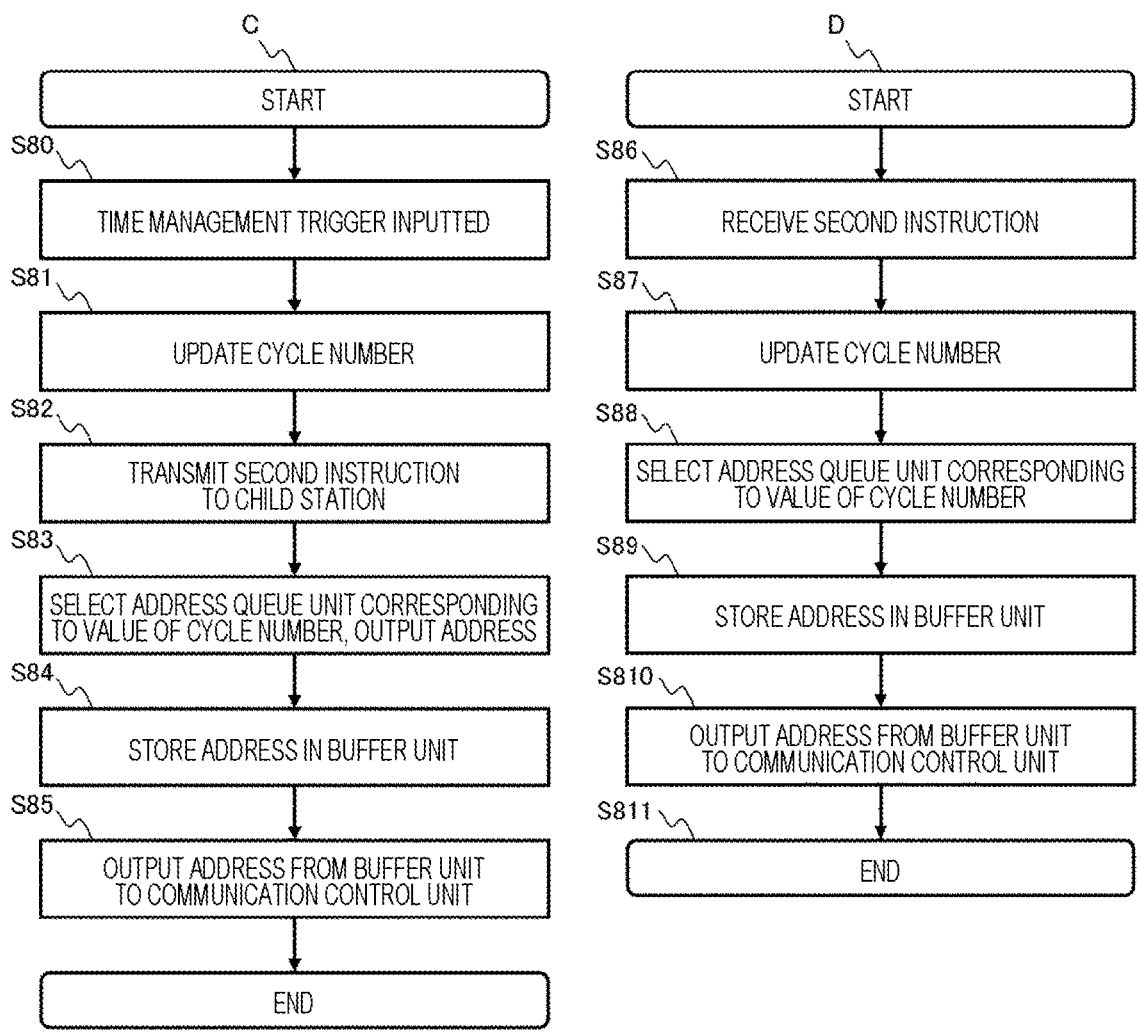
FIG. 8 is a diagram illustrating a procedure for transfer control.

Next, transfer control is a function for performing communication band control while maintaining the timetable 5 for data transfer set by the scheduling processing while the distributed control system 1 is performing apparatus control. FIG. 8 is a diagram illustrating a procedure for the transfer control. Note that C indicates a procedure in the communication parent station 10, and D indicates a procedure in the communication child stations 11.

First, C will be described. In the communication parent station 10, the processing of C is started when the central processing unit 13 or the parent station communication control unit 100 activates a time management trigger for apparatus control. At this time, the time management trigger is a signal issued every reference cycle. In C, after receiving the input of the time management trigger in S80, the cycle management unit 38 updates the cycle number in S81. Next, in S82, the communication parent station 10 transmits the second instruction including the cycle number to all the communication child stations. Here, the second instruction is an instruction for reporting the start of the transfer control. Further, in S83, the queue selection unit 34 selects the address queue unit 33 corresponding to the cycle number, and outputs the stored address. At this time, as the addresses stored in the address queue unit 33, the address to be transmitted and the address to be received are outputted simultaneously. Therefore, in S84, the buffer selection unit 35 outputs the address of the data to be transmitted to a transmission buffer unit 36, and outputs the address of the data to be received to the reception buffer unit 36. Finally, in S85, the parent station communication control unit 100 generates the packet 2 while referring to the address stored in the buffer unit 36, and transmits the packet 2 to the communication child stations 11.

Next, D will be described. In the communication child stations 11, after the child station communication control unit 110 receives the second instruction in S86, the cycle number is updated in S87. Because the processing from S88 to S810 is the same as the processing from S83 to S85 in C, a description thereof will be omitted here.

Figure 9:
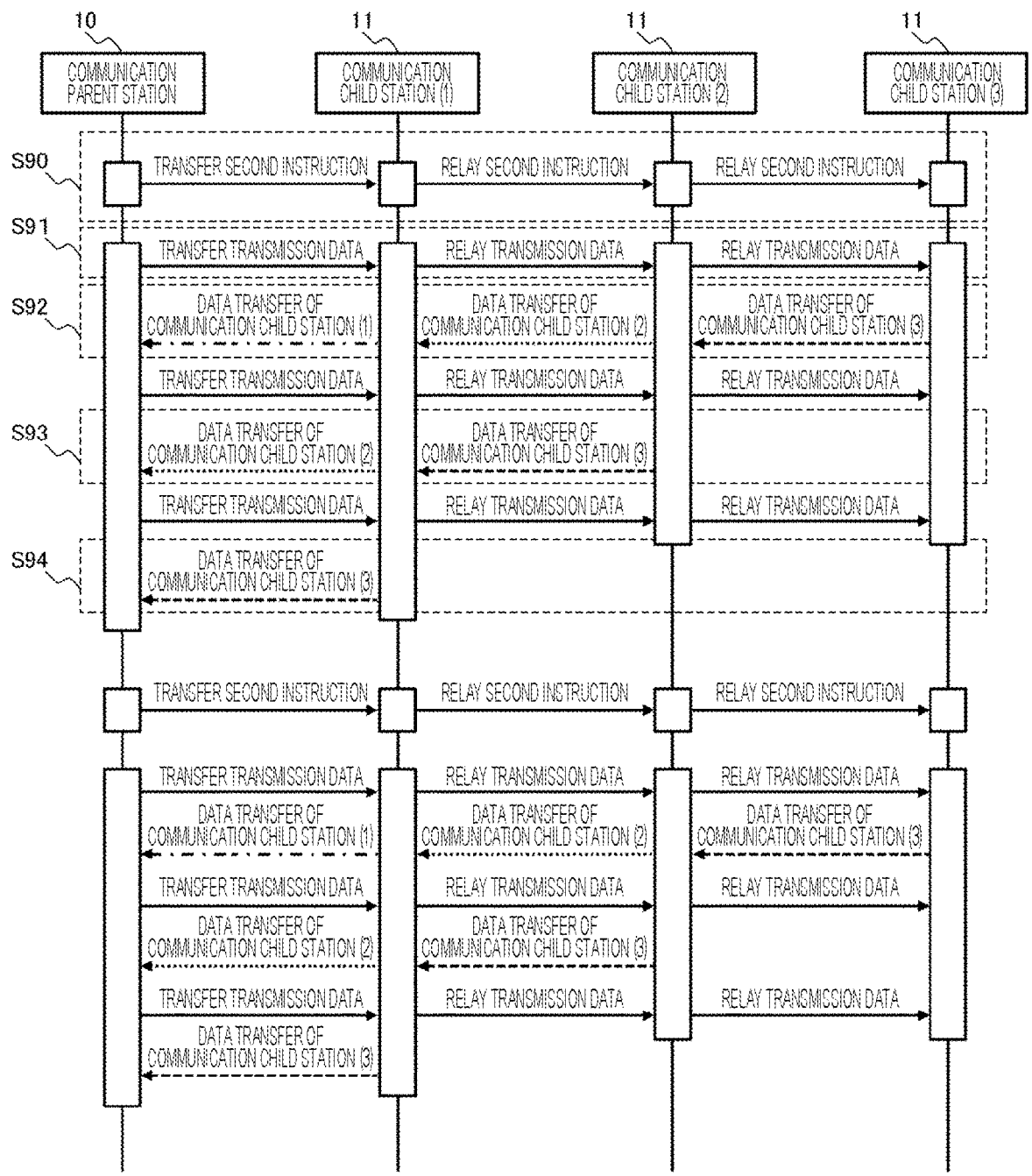
FIG. 9 is a diagram illustrating the operation of the distributed control system when transfer control is executed.

The communication operation of the distributed control system 1, when the transfer control described above is executed, is illustrated in FIG. 9. The vertical direction in FIG. 9 represents the lapse of time, and is based on the configuration of the distributed control system 1 illustrated in FIG. 1. As described using FIG. 8, the communication parent station 10 transmits the second instruction to the communication child station 11 in response to the issuance of the time management trigger. This is described in S90 of FIG. 9. The second instruction transmitted from the communication parent station 10 first arrives at the communication child station 11(1). At this time, the communication child station 11(1) receives the packet 2 which is the second instruction while directly relaying the transmission signal to the communication child station 11(2). Furthermore, because this operation is also executed in the communication child station 11(2), the second instruction is also relayed to the communication child station 11(3). Due to such signal transmission, in the communication in the downstream direction from the communication parent station 10, each of the communication child stations 11 is capable of simultaneously receiving the second instruction or the other packet 2 transmitted from the communication parent station 10. Next, in S91, the communication parent station 10 sequentially reads addresses from the transmission buffer unit 36, generates transmission data, and then broadcasts the transmission data to all the communication child stations 11. Upon receiving the transmission data, the communication child stations 11 check the address unit 20 of the packet 2, receive the data only when the destination is their own communication child station 11, and otherwise discard the data. In S92, each of the communication child stations 11 that has received the second instruction reads the address from each of the buffer units 36, generates the data to be returned to the communication parent station 10, and transfers the data in the upstream direction. FIG. 9 illustrates a case where the three communication child stations 11 perform data transfer one by one. In the communication in the upstream direction, each communication child station 11 transfers the data to the next communication child station 11 as soon as reception of the packet 2 is complete, instead of directly relaying the transmission signal. In this manner, data of the packet 2 is transferred while hopping the communication child station 11 connected to the communication parent station 10. Therefore, in S93 and S94, it can be seen that the data from the three communication child stations 11 arrives at the communication parent station 10 in order. Note that, for the sake of expediency in the illustration in FIG. 9, data transfer in the downstream direction and data transfer in the upstream direction are executed alternately as per S91 and S92, but there is no problem even if these two types of data transfer are executed simultaneously. In addition, in the transfer control, the data transfer from S90 to S94 is executed for each time management trigger. Using such a data transfer mechanism, the distributed control system 1 is capable of making the delay time constant for all data transfers.

Here, an example of a log of received data that can be observed by the communication parent station 10 when the distributed control system 1 executes communication band control is illustrated in FIG. 10. The data log 1000 is log information for one cycle of communication band control. In the data log 1000, the address of the received data is listed for each cycle number. FIG. 10 illustrates an example in which the cycle numbers are from 1 to 20, and twenty kinds of address groups of received data correspond to one cycle of the communication band control. At this time, because the distributed control system 1 repeats this processing, the same log information as that of the data log 1000 can be obtained in just one cycle of the next communication band control, and, although the content of the address is different, the communication child station 11 is also capable of obtaining a data log 1000 with the same regularity. That is, the communication parent station 10 or the communication child station 11 connected to the distributed control system 1 can have, as known information, the address of the data received by each of the parent station or the child station in each reference cycle, and, upon receiving the data, is capable of using the received data to check the data that has been received. In the unlikely event that there is data that cannot be received due to a communication abnormality or the like, the abnormality can be detected using the known information.

Figure 11:
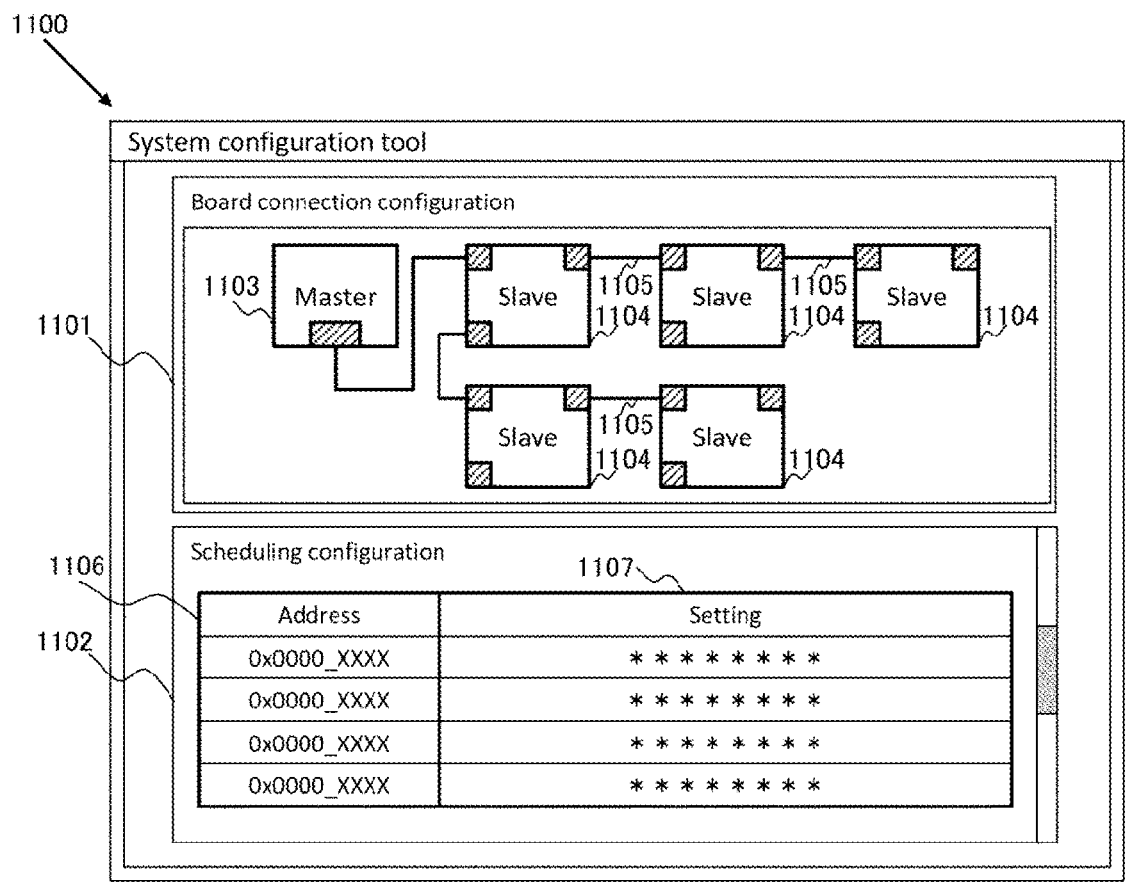
FIG. 11 is a diagram illustrating a system settings screen of the distributed control system.

FIG. 11 illustrates an example of a system settings screen 1100, which is a tool for operating the distributed control system 1. The system settings screen 1100 includes a communication station configuration screen 1101 and a schedule settings screen 1102. Here, the communication station configuration screen 1101 is capable of setting the system configuration of the distributed control system 1 by using a connector 1105 to connect, in an optional configuration, at least one communication parent station model 1103 imitating the communication parent station 10, and at least one communication child station model 1104 imitating the communication child station 11. The schedule settings screen 1102 includes an address unit 1106 and a settings input unit 1107. The address unit 1106 then displays the address of the data handled by the distributed control system 1, and the settings input unit 1107 inputs the setting value for the scheduling processing according to each address, that is, the data displayed by the address unit 1106. At this time, the system settings screen 1100 may be connected to the distributed control system 1 via the central processing unit 13. In addition, by using the system settings screen 1100 to set the scheduling processing, information on the transfer timing of the transfer data can be obtained in the form of the timetable 5, and the distributed control system 1 is capable of realizing communication band control on the basis of the information.

According to an aspect of this embodiment, the distributed control system 1 is capable of ensuring a communication band and a constant communication delay for the inputting/outputting of all data necessary for control of the apparatus.

Second Embodiment

Figure 12:
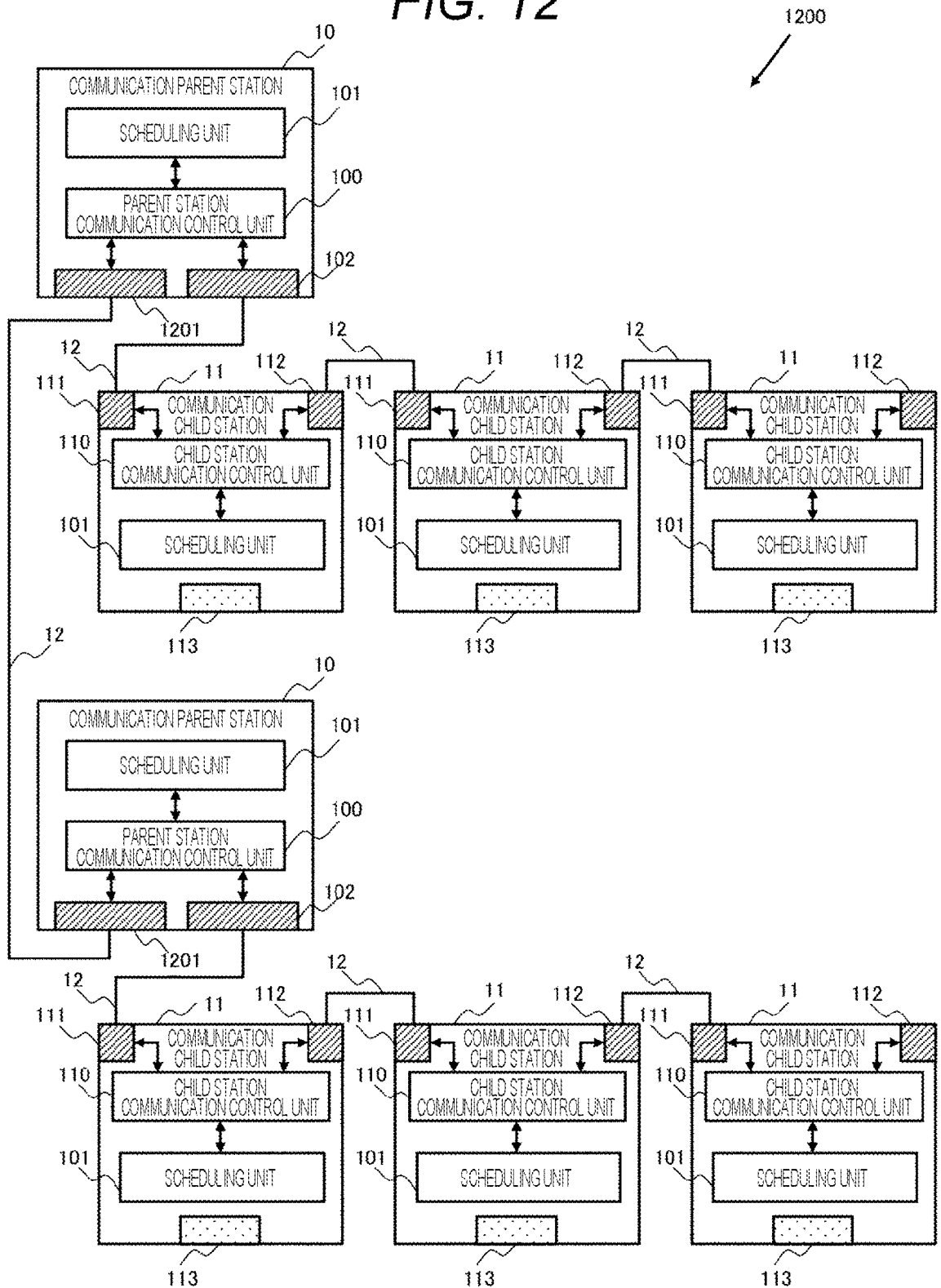
FIG. 12 is a diagram illustrating a configuration example in a case where two or more communication parent stations are provided in the distributed control system.

FIG. 12 illustrates a distributed control system 1200 obtained by expanding the distributed control system 1 according to a second embodiment. In the distributed control system 1200 according to this embodiment, a plurality of distributed control systems 1 are connected via expansion ports 1201 provided to the communication parent stations 10.

According to this embodiment, the distributed control system 1200 is capable of performing independent communication band control in a network system centered on each of the communication parent stations 10, and of cooperating via each of the communication parent stations 10 while controlling different control targets.

Third Embodiment

Figure 13:
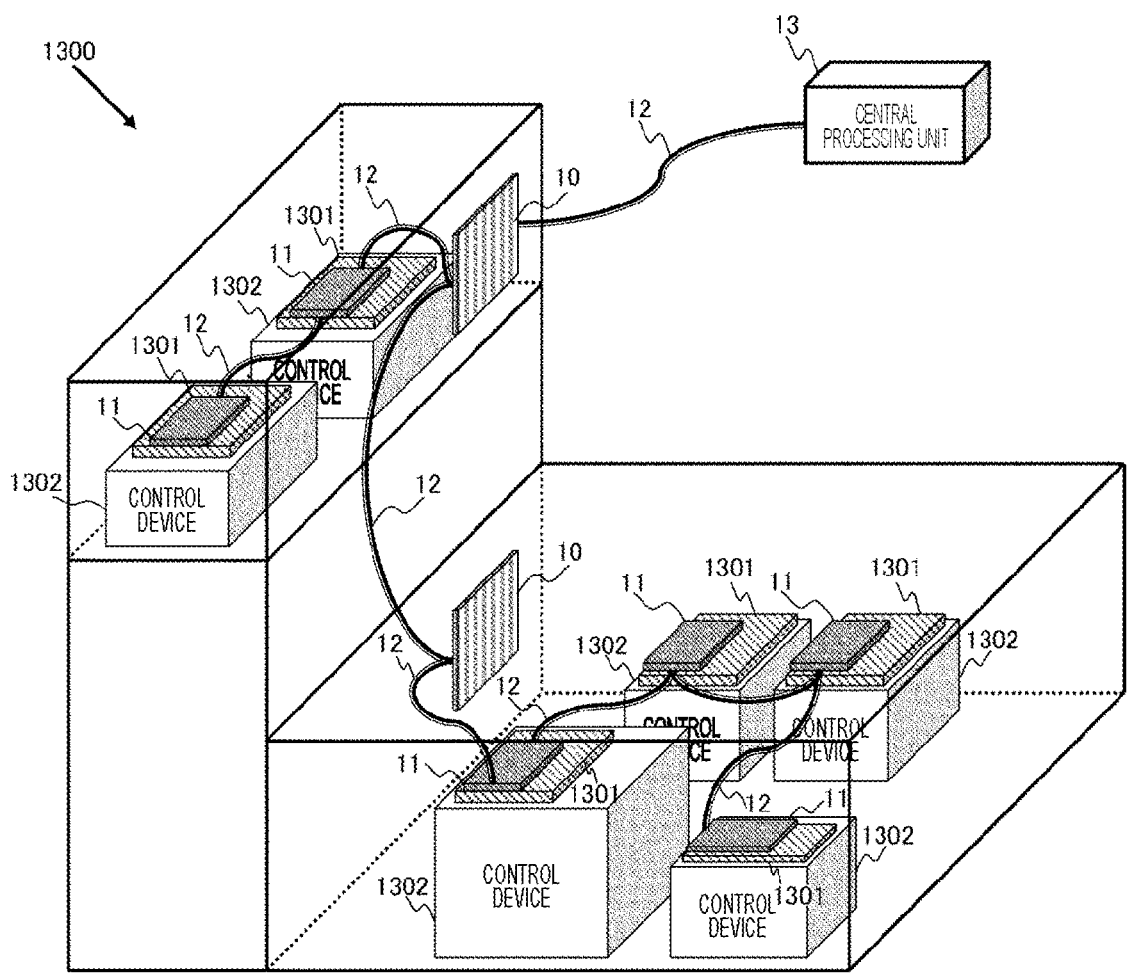
FIG. 13 is a diagram illustrating a case where the distributed control system is applied to a semiconductor inspection apparatus.

FIG. 13 illustrates a case, according to a third embodiment, in which the distributed control system 1200 is applied to a semiconductor inspection apparatus 1300. The semiconductor inspection apparatus 1300 includes communication parent stations 10, communication child stations 11, a central processing unit 13, input/output control apparatuses 1301, and control devices 1302. Here, the communication parent stations 10 are connected to the communication child stations 11 via the central processing unit 13 and the communication path 12, and manage communication control of the distributed control network. The communication child stations 11 are connected to another communication child station 11 or the communication parent stations 10 or to both via the communication path 12, are further connected to the control devices 1302 via the input/output control apparatuses 1301, and receive or relay data transferred from the communication parent stations 10 and transfer or relay data to the communication parent stations 10. The central processing unit 13 is connected to the communication parent stations 10 and executes operation and setting of the semiconductor inspection apparatus 1300. The input/output control apparatuses 1301 perform digital-to-analog conversion of outputs to the control devices 1302 or analog-to-digital conversion of inputs thereto. The control devices 1302 are control targets of the semiconductor inspection apparatus 1300, i.e. drivers such as servo motors or sensors such as laser interferometers.

According to this embodiment, by applying the distributed control system 1 or the distributed control system 1200 to the semiconductor inspection apparatus 1300, the control system can be optimally arranged in an optional space, and the number of assembly steps can be reduced due to the advantageous effect of reducing the analog wiring.

REFERENCE SIGNS LIST 1 distributed control system
10 communication parent station
100 parent station communication control unit
101 scheduling unit
102 communication port
11 communication child station
110 child station communication control unit
111 upstream communication port
112 downstream communication port
113 input/output port
12 communication path
13 central processing unit
2 packet
20 address unit
21 command unit
22 synchronization unit
23 data unit
30 settings decoding unit
31 write enable storage unit
32 writing unit
33 address queue unit
34 queue selection unit
35 buffer selection unit
36 buffer unit
37 memory unit
38 cycle management unit
5 timetable
50 transfer data
70 write enable
71 plurality of address queue units
72 transfer target queue
1000 data log
1100 system settings screen
1101 communication station configuration screen
1102 schedule settings screen
1103 communication parent station model
1104 communication child station model
1105 connector
1106 address unit
1107 settings input unit
1200 distributed control system
1201 expansion port
1300 semiconductor inspection apparatus
1301 input/output control apparatus
1302 control device

The invention claimed is:

1. A distributed control system comprising a tree topology network or a daisy-chain network including a communication parent station, communication child stations, and a plurality of communication paths among the communication parent station and the communication child stations,
    wherein the communication parent station and the communication child stations include a scheduling unit that controls a transfer cycle that is temporal intervals of data transfer,
    the scheduling unit sets the transfer cycle that is a fastest out of a plurality of the data as a reference cycle,
    counts a number of times each time the reference cycle elapses, and imparts a value of the number of times to the reference cycle as a cycle number,
    when the cycle number reaches an optional number, the number of times is returned to an initial value, which makes one cycle of transfer control, and the transfer control is repeatedly executed, and
    for a timing of the reference cycle at which the data is transferred, the scheduling unit performs communication band control by executing scheduling processing to define the cycle number to which the reference cycle corresponds, on a basis of predetermined information corresponding to the data,
    wherein the scheduling unit of the communication parent station reads the predetermined information from a memory unit while the communication parent station transmits an instruction for starting the scheduling processing to the communication child stations via at least one of the plurality of communication paths, and
    wherein different cycle numbers are set for transferring the data of a same transfer cycle.

2. The distributed control system according to claim 1, wherein the scheduling unit starts transferring second data having a second transfer cycle that is longer than the reference cycle before an end of transfer of other data having the same transfer cycle, and determines a transfer timing to distribute the data transferred in the reference cycle.

3. A semiconductor inspection apparatus comprising the distributed control system according to claim 1.

4. A distributed control system comprising a tree topology network or a daisy-chain network including a communication parent station, communication child stations, and a plurality of communication paths among the communication parent station and the communication child stations,
   wherein the communication parent station and the communication child stations include a scheduling unit that controls a transfer cycle that is temporal intervals of data transfer,
   the scheduling unit sets the transfer cycle that is a fastest out of a plurality of the data as a reference cycle,
   counts a number of times each time the reference cycle elapses, and imparts a value of the number of times to the reference cycle as a cycle number,
   when the cycle number reaches an optional number, the number of times is returned to an initial value, which makes one cycle of transfer control, and the transfer control is repeatedly executed, and
   for a timing of the reference cycle at which the data is transferred, the scheduling unit performs communication band control by executing scheduling processing to define the cycle number to which the reference cycle corresponds, on a basis of predetermined information corresponding to the data,
   wherein the scheduling unit of the communication parent station reads the predetermined information from a memory unit while the communication parent station transmits an instruction for starting the scheduling processing to the communication child stations via at least one of the plurality of communication paths, and wherein:
   the scheduling unit includes an address queue unit,
   the scheduling processing stores an address of the data in the address queue unit corresponding to the cycle number, and
   when the address is stored in the address queue unit,
   the scheduling unit selects the address queue unit in which the address is stored by using a write enable that is generated based on the predetermined information, and
   the scheduling unit performs the transfer control by reading the address stored in the corresponding address queue unit based on an update of the cycle number.

5. The distributed control system of claim 4, wherein the address queue unit correspond to a maximum value of the cycle number.

6. The distributed control system of claim 4, wherein the communication parent station or the communication child stations or both of the communication parent station and the communication child stations use the address known by the scheduling processing to perform an abnormality notification in a case where, while confirming whether or not the data expected to be received during the transfer control has arrived during a reference period, the data has not arrived.

7. A semiconductor inspection apparatus comprising the distributed control system according to claim 4.

8. A distributed control system comprising a tree topology network or a daisy-chain network including a communication parent station, communication child stations, and a plurality of communication paths among the communication parent station and the communication child stations,
   wherein the communication parent station and the communication child stations include a scheduling unit that controls a transfer cycle that is temporal intervals of data transfer,
   the scheduling unit sets the transfer cycle that is a fastest out of a plurality of the data as a reference cycle,
   counts a number of times each time the reference cycle elapses, and imparts a value of the number of times to the reference cycle as a cycle number,
   when the cycle number reaches an optional number, the number of times is returned to an initial value, which makes one cycle of transfer control, and the transfer control is repeatedly executed, and
   for a timing of the reference cycle at which the data is transferred, the scheduling unit performs communication band control by executing scheduling processing to define the cycle number to which the reference cycle corresponds, on a basis of predetermined information corresponding to the data,
   wherein the scheduling unit of the communication parent station reads the predetermined information from a memory unit while the communication parent station transmits an instruction for starting the scheduling processing to the communication child stations via at least one of the plurality of communication paths.

9. The distributed control system according to claim 8, further comprising a central processing unit,
   wherein the central processing unit transmits at least one piece of the predetermined information to the communication parent station so that
   the predetermined information is transmitted to the communication child stations via at least one of the plurality of communication paths, and
   the predetermined information is shared between the communication parent station and the communication child stations.

10. The distributed control system according to claim 8, wherein the instruction is a first instruction, and wherein
   the scheduling unit includes the memory unit,
   the communication parent station and the communication child stations store the received predetermined information in the memory unit,
   while the communication parent station transmits the first instruction for starting the scheduling processing to the communication child stations via at least one of the plurality of communication paths,
   the scheduling unit included in the communication parent station reads the predetermined information in the memory unit and executes the scheduling processing, and
   when the communication child stations receive the first instruction,
   a plurality of scheduling units included in the communication child stations read the predetermined information in the memory unit and execute the scheduling processing.

11. The distributed control system according to claim 8, wherein
   the communication parent station periodically transmits a second instruction, which is a factor signal for executing the transfer control, to the communication child stations via at least one of the plurality of communication paths, and
   a plurality of scheduling units of the communication parent station and the communication child stations perform the transfer control while updating the cycle number based on the second instruction.

12. The distributed control system according to claim 8, wherein the predetermined information is information including a transfer interval of the data, the cycle number for starting the transfer, and a communication direction for determining transmission data or reception data.

13. The distributed control system according to claim 10, wherein
the scheduling unit includes at least one address queue unit or an address queue unit corresponding to a maximum value of the cycle number,
the scheduling processing stores an address of the data in the address queue unit corresponding to the cycle number, and
when the address is stored in the address queue unit,
the scheduling unit selects the address queue unit in which the address is stored by using a write enable that is generated based on the predetermined information, and
the scheduling unit performs the transfer control by reading the address stored in the corresponding address queue unit based on an update of the cycle number.

14. The distributed control system according to claim 13, wherein the communication parent station or the communication child stations or both of the communication parent station and the communication child stations use the address known by the scheduling processing to perform an abnormality notification in a case where, while confirming whether or not the data expected to be received during the transfer control has arrived during a reference period, the data has not arrived.

15. The distributed control system according to claim 8, wherein
in a communication direction from the communication parent station to the communication child stations, the communication parent station simultaneously transfers, at a time point, only one piece of data to all the communication child stations connected to the distributed control system, and
in a communication direction from the communication child stations to the communication parent station, data transmitted by at least one of the communication child stations is transferred to the communication parent station for aggregation while being relayed by another of the communication child stations connected to the distributed control system.

16. The distributed control system according to claim 8, further comprising a system settings screen,
wherein, in the distributed control system, a connection configuration between the communication parent station and the communication child stations is created using the system settings screen, and
the predetermined information is set for each piece of the data.

17. The distributed control system according to claim 8, wherein a plurality of communication parent stations are connected to each other via at least one of the plurality of communication paths.

18. A semiconductor inspection apparatus comprising the distributed control system according to claim 17.

19. The distributed control system according to claim 8, further comprising:
an input/output control apparatus; and
a sensor and/or an actuator,
wherein the communication child stations are connected to the input/output control apparatus, and
the input/output control apparatus is connected to the sensor and/or the actuator.

* * * * *